(12) United States Patent
Wang et al.

(10) Patent No.: US 11,011,247 B2
(45) Date of Patent: May 18, 2021

(54) SOURCE DRIVING SUB-CIRCUIT AND DRIVING METHOD THEREOF, SOURCE DRIVING CIRCUIT, AND DISPLAY DEVICE

(71) Applicants: ORDOS YUANSHENG OPTOELECTRONICS CO., LTD., Ordos (CN); BOE TECHNOLOGY GROUP CO., LTD., Beijing (CN)

(72) Inventors: Jiguo Wang, Beijing (CN); Jun Fan, Beijing (CN); Yishan Fu, Beijing (CN)

(73) Assignees: ORDOS YUANSHENG OPTOELECTRONICS CO., LTD., Ordos (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/617,127

(22) PCT Filed: Aug. 7, 2018

(86) PCT No.: PCT/CN2018/099229
§ 371 (c)(1),
(2) Date: Nov. 26, 2019

(87) PCT Pub. No.: WO2019/080589
PCT Pub. Date: May 2, 2019

(65) Prior Publication Data
US 2020/0251173 A1    Aug. 6, 2020

(30) Foreign Application Priority Data
Oct. 26, 2017 (CN) .......................... 201711029352.X

(51) Int. Cl.
*G11C 19/28* (2006.01)
*G09G 3/3275* (2016.01)
*G09G 3/36* (2006.01)

(52) U.S. Cl.
CPC .......... *G11C 19/287* (2013.01); *G09G 3/3275* (2013.01); *G09G 3/3648* (2013.01); *G09G 2310/0286* (2013.01)

(58) Field of Classification Search
CPC combination set(s) only.
See application file for complete search history.

(56) References Cited

U.S. PATENT DOCUMENTS

| 4,963,860 A | 10/1990 | Stewart |
| 7,196,308 B2 | 3/2007 | Okutani |

(Continued)

FOREIGN PATENT DOCUMENTS

| CN | 1482507 A | 3/2004 |
| CN | 1940645 A | 4/2007 |

(Continued)

OTHER PUBLICATIONS

International Search Report and Written Opinion issued in corresponding International Application No. PCT/CN20181099229, dated Nov. 2, 2018, with English translation.

(Continued)

*Primary Examiner* — Deeprose Subedi
(74) *Attorney, Agent, or Firm* — McDermott Will & Emery LLP

(57) ABSTRACT

A source driving sub-circuit includes a shift register circuit and a latch circuit. The latch circuit includes a resetter and a latch. The resetter is coupled to an enabling signal terminal, a reset signal terminal and the latch. The latch is coupled to the shift register circuit and a data signal terminal. The latch is configured to receive signals output from the shift register circuit and at least in response to the signals output from the shift register circuit. And the resetter is configured to receive a signal provided from the enabling signal terminal and a signal provided from the reset terminal, and reset (Continued)

the at least one data signal latched by the latch in response to the signal provided from the enabling signal terminal.

16 Claims, 11 Drawing Sheets

(56) References Cited

U.S. PATENT DOCUMENTS

| | | |
|---|---|---|
| 2004/0017344 A1 | 1/2004 | Takemoto |
| 2007/0070011 A1 | 3/2007 | Tang |
| 2007/0070750 A1 | 3/2007 | Park |
| 2010/0128009 A1 | 5/2010 | Okada et al. |
| 2011/0007040 A1 | 1/2011 | John et al. |
| 2011/0199353 A1* | 8/2011 | Chung .................. G11C 19/28 345/208 |
| 2014/0225817 A1 | 8/2014 | Huang et al. |
| 2017/0169780 A1 | 6/2017 | Zhao |
| 2018/0034462 A1 | 2/2018 | Zhao |
| 2018/0061348 A1 | 3/2018 | Zhao |
| 2018/0240432 A1 | 8/2018 | Zhao |
| 2018/0301102 A1 | 10/2018 | Yi |
| 2019/0206504 A1 | 7/2019 | Tao et al. |
| 2020/0111399 A1 | 4/2020 | Wang et al. |

FOREIGN PATENT DOCUMENTS

| | | |
|---|---|---|
| CN | 107180619 A | 9/2017 |
| CN | 107633817 A | 1/2018 |
| TW | 200713176 A | 4/2007 |

OTHER PUBLICATIONS

Office Action dated Jan. 11, 2021 in U.S. Appl. No. 16/611,754.

\* cited by examiner

SOURCE DRIVING SUB-CIRCUIT AND DRIVING METHOD THEREOF, SOURCE DRIVING CIRCUIT, AND DISPLAY DEVICE

CROSS-REFERENCE TO RELATED APPLICATION

This application is a national phase entry under 35 USC 371 of International Patent Application No. PCT/CN2018/099229 filed on Aug. 7, 2018, which claims priority to Chinese Patent Application No. 201711029352.X, filed with the Chinese Patent Office on Oct. 26, 2017, titled "SOURCE DRIVING UNIT AND DRIVING METHOD THEREOF, SOURCE DRIVING CIRCUIT, AND DISPLAY DEVICE", which are incorporated herein by reference in their entirety.

TECHNICAL FIELD

The present disclosure relates to the field of display technologies, and in particular, to a source driving sub-circuit and a driving method thereof, a source driving circuit, and a display device.

BACKGROUND

A display panel of a display is provided with crisscrossed gate lines and data lines. The gate lines turn on sub-pixels row by row. When a row of sub-pixels are turned on, data signals are input to the turned-on sub-pixels through the data lines. When all of the sub-pixels receive the above data signals, the display panel displays one frame.

SUMMARY

Some embodiments of the present disclosure provide a source driving sub-circuit including a shift register circuit and a latch circuit, and the shifter register circuit is coupled to the latch circuit. The latch circuit includes a resetter and a latch. The resetter is coupled to an enabling signal terminal, a reset signal terminal and the latch. The latch is coupled to the shift register circuit and a data signal terminal. The latch is configured to receive signals output from the shift register circuit and at least one data signal provided from the data signal terminal, and latch the received at least one data signal in response to the signals output from the shift register circuit. The resetter is configured to receive a signal provided from the enabling signal terminal and a signal provided from the reset terminal, and reset the at least one data signal latched by the latch in response to the signal provided from the enabling signal terminal.

In some embodiments, the latch includes at least one stage sub-circuit.

In some embodiments, the at least one stage sub-circuit includes a first stage sub-circuit and a second stage sub-circuit. The resetter is coupled to the first stage sub-circuit or the second stage sub-circuit. The first stage sub-circuit is coupled to the shift register circuit, the data signal terminal and the second stage sub-circuit. The first stage sub-circuit is configured to receive the signals output from the shift register circuit and the at least one data signal provided from the data signal terminal, and latch the at least one data signal in response to the signals output from the shift register circuit, and output the at least one data signal to the second stage sub-circuit. The second stage sub-circuit is configured to latch the at least one data signal output from the first stage sub-circuit.

In some embodiments, the resetter includes a reset transistor. A gate of the reset transistor is coupled to the enabling signal terminal, a first electrode of the reset transistor is coupled to the reset signal terminal, and a second electrode of the reset transistor is coupled to the first stage sub-circuit or the second stage sub-circuit.

In some embodiments, the first stage sub-circuit includes a first transmission sub-circuit and a first latch sub-circuit. The first transmission sub-circuit is coupled to a first control signal terminal of the shift register circuit, the data signal terminal and a first latch node. The first transmission sub-circuit is configured to transmit at least one data signal provided from the data signal terminal to the first latch node in response to a signal provided from the first control signal terminal of the shift register circuit. The first latch sub-circuit is coupled to the first latch node, the second stage sub-circuit and a second control signal terminal of the shift register circuit. The first latch sub-circuit is configured to latch the at least one data signal provided from the first latch node in response to a signal provided from the second control signal terminal of the shift register circuit, and output the at least one data signal to the second stage sub-circuit.

In some embodiments, the second stage sub-circuit includes a second transmission sub-circuit and a second latch sub-circuit. The second transmission sub-circuit is coupled to the first stage sub-circuit, a first turn-on signal terminal and a second latch node. The second transmission sub-circuit is configured to transmit signal output from the first stage sub-circuit to the second latch node in response to a signal provided from the first turn-on signal terminal. The second latch sub-circuit is coupled to the second latch node and a second turn-on signal terminal. The second latch sub-circuit is configured to latch the at least one data signal provided from the second latch node and output the at least one data signal in response to a signal provided from the second turn-on signal terminal.

In some embodiments, the first transmission sub-circuit includes a first transmission gate. An input terminal of the first transmission gate is coupled to the data signal terminal, a first control terminal and a second control terminal of the first transmission gate are respectively coupled to the first control signal terminal and the second control signal terminal of the shift register circuit, and an output terminal of the first transmission gate is coupled to the first latch node.

In some embodiments, the first latch sub-circuit includes a second transmission gate, a first inverter, a second inverter, and a third inverter.

An input terminal of the second transmission gate is coupled to an output terminal of the third inverter, a first control terminal and a second control terminal of the second transmission gate are respectively coupled to the first control signal terminal and the second control signal terminal of the shift register circuit, and an output terminal of the second transmission gate is coupled to the first latch node.

An input terminal of the first inverter is coupled to the first latch node, and an output terminal of the first inverter is coupled to an input terminal of the third inverter and an input terminal of the second inverter. An output terminal of the second inverter is coupled to the second stage sub-circuit.

On this basis, in some embodiments, the resetter is coupled to the first stage sub-circuit and the resetter includes a reset transistor, a gate of reset transistor is coupled to the enabling signal terminal, a first electrode of the reset transistor is coupled to the reset signal terminal, and a second electrode of the reset transistor is coupled to the input terminal of the first inverter.

In some other embodiments, the resetter is coupled to the first stage sub-circuit and the resetter includes a reset transistor, a gate of reset transistor is coupled to the enabling signal terminal, a first electrode of the reset transistor is coupled to the reset signal terminal, and a second electrode of the reset transistor is coupled to the output terminal of the first inverter.

In some embodiments, the second transmission sub-circuit includes a third transmission gate. An input terminal of the third transmission gate is coupled to the first stage sub-circuit, a first control terminal and a second control terminal of the third transmission gate are respectively coupled to the first turn-on signal terminal and the second turn-on signal terminal, and an output terminal of the third transmission gate is coupled to the second latch node.

In some embodiments, the second latch sub-circuit includes a fourth transmission gate, a fourth inverter, a fifth inverter and a sixth inverter.

A first control terminal and a second control terminal of the fourth transmission gate are respectively coupled to the first turn-on signal terminal and the second turn-on signal terminal, an input terminal of the fourth transmission gate is coupled to an output terminal of the fifth inverter, and an output terminal of the fourth transmission gate is coupled to the second latch node. The output terminal of the fourth inverter is coupled to the input terminal of the fifth inverter and an input terminal of the sixth inverter. And an output terminal of the sixth inverter is used as an output terminal of the second stage sub-circuit.

Or, a first control terminal and a second control terminal of the fourth transmission gate are respectively coupled to the first turn-on signal terminal and the second turn-on signal terminal, an input terminal of the fourth transmission gate is coupled to an output terminal of the fourth inverter, and an output terminal of the fourth transmission gate is coupled to an input terminal of the fifth inverter. The input terminal of the fourth inverter is coupled to the output terminal of the fifth inverter, and the output terminal of the fourth inverter is further coupled to an input terminal of the sixth inverter. An output terminal of the sixth inverter is an output terminal of the second stage sub-circuit.

On this basis, in some embodiments, the resetter is coupled to the second stage sub-circuit and the resetter includes a reset transistor, a gate of reset transistor is coupled to the enabling signal terminal, a first electrode of the reset transistor is coupled to the reset signal terminal, and a second electrode of the reset transistor is coupled to an input terminal of the fourth inverter.

In some other embodiments, the resetter is coupled to the first stage sub-circuit and the resetter includes a reset transistor, a gate of reset transistor is coupled to the enabling signal terminal, a first electrode of the reset transistor is coupled to the reset signal terminal, and a second electrode of the reset transistor is coupled to the output terminal of the fourth inverter.

In some embodiments, the latch circuit further includes a buffer including a seventh inverter and an eighth inverter.

An input terminal of the seventh inverter is coupled to an output terminal of the second stage sub-circuit, and an output terminal of the seventh inverter is coupled to an input terminal of the eighth inverter. An output terminal of the eighth inverter is an output terminal of the source driving sub-circuit.

Some embodiments of the present disclosure provide a source driving circuit including a plurality of any source driving sub-circuit described above arranged side by side. Shift register circuits in the plurality of source driving sub-circuits are cascaded in sequence.

Some embodiments of the present disclosure provide a display device including a host driver and the source driving circuit described above. The host driver is coupled to source driving sub-circuits of the source driving circuit through data signal terminals.

Some embodiments of the present disclosure provide a method for driving the source driving sub-circuit described above. A latch of the source driving sub-circuit includes a first stage sub-circuit and a second stage sub-circuit, the method includes:

resetting, by a resetter, at least one data signal latched by the first stage sub-circuit or at least one data signal latched by the second stage sub-circuit in response to a signal provided from an enabling signal terminal;

latching, by the first stage sub-circuit, at least one data signal provided from a data signal terminal in response to signals output from a shift register circuit;

outputting, by the first stage sub-circuit, the at least one data signal to the second stage sub-circuit; and latching, by the second stage sub-circuit, the at least one data signal output from the first stage sub-circuit.

In some embodiments, a resetter of the source driving sub-circuit includes a reset transistor, resetting, by the resetter, the at least one data signal latched by the first stage sub-circuit in response to a signal provided from the enabling signal terminal, includes: controlling, by the signal provided from the enabling signal terminal, the reset transistor to be turned on, and outputting a signal provided from a reset signal terminal to the first stage sub-circuit through the reset transistor.

In some other embodiments, a resetter of the source driving sub-circuit includes a reset transistor, resetting, by the resetter, the at least one data signal latched by the second stage sub-circuit in response to a signal provided from the enabling signal terminal, includes: controlling, by the signal provided from the enabling signal terminal, the reset transistor to be turned on, and outputting a signal provided from a reset signal terminal to the second stage sub-circuit through the reset transistor.

In some embodiments, the latch is further configured to be coupled to at least one data line, and output the at least one data signal to the at least one data line correspondingly.

In some embodiments, the first stage sub-circuit is further configured to be coupled to at least one data line; and the second stage sub-circuit is configured to output the at least one data signal to the at least one data line correspondingly.

In some embodiments, the method for driving the source driving sub-circuit further includes outputting, by the second stage sub-circuit, the latched at least one data signal to corresponding at least one data line.

BRIEF DESCRIPTION OF THE DRAWINGS

In order to describe technical solutions in embodiments of the present disclosure or in the prior art more clearly, the accompanying drawings to be used in the description of embodiments or in the prior art will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

The technical solutions in embodiments of the present disclosure will be described clearly and completely with reference to the accompanying drawings in embodiments of the present disclosure. Obviously, the described embodiments are merely some but not all of embodiments of the present disclosure. All other embodiments made on the basis of the embodiments of the present application by a person of ordinary skill in the art shall be included in the protection scope of the present disclosure.

The terms "first" and "second" are used for descriptive purposes only and are not to be construed as indicating or implying the relative importance or implicitly indicating the number of indicated technical features below. Thus, features defined as "first", "second" may explicitly or implicitly include one or more of the features. In the description of the embodiments of the present disclosure, "plurality" means two or more unless otherwise specified.

Mobile display devices such as mobile phones are small in size, in this case, battery capacities are also low. Therefore, a user needs to frequently charge the mobile phone during use, thereby affecting experiences of the user. In order to solve the above problem, a MIP (Memory In Pixel) technique may be used to improve capabilities of sub-pixels to maintain voltages. In this way, when a static image is displayed, a refresh frequency of the display device may be reduced, thereby reducing a power consumption of a product and saving power.

Regarding to a display device using the MIP technique, data lines may be driven by a source driving integrated circuit (IC), or the data lines may be driven by source driving sub-circuit(s) 1 provided by some embodiments of the present disclosure.

Figure 1:
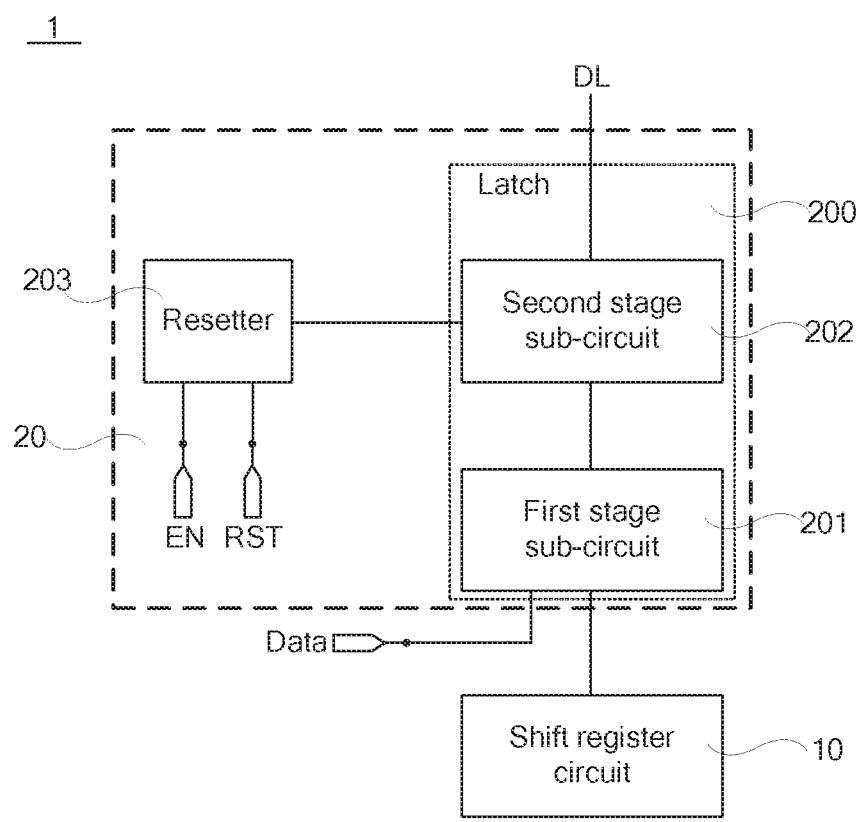
FIG. 1 is a schematic diagram showing a structure of a source driving sub-circuit, in accordance with some embodiments of the present disclosure.
Figure 2:
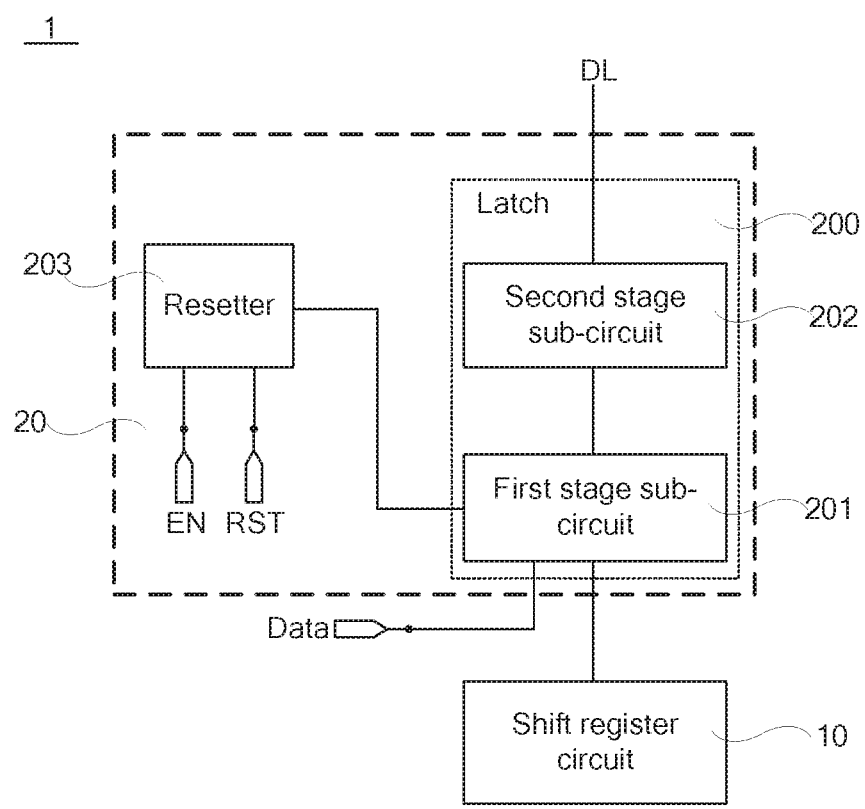
FIG. 2 is a schematic diagram showing a structure of another source driving sub-circuit, in accordance with some embodiments of the present disclosure.

In some embodiments of the present disclosure, the source driving sub-circuit 1, as shown in FIG. 1 or FIG. 2, includes a shift register circuit 10 and a latch circuit 20, and the shift register circuit 10 is coupled to the latch circuit 20.

A display panel provided with the source driving sub-circuit 1 has a display area and a non-display area disposed around the display area. The source driving sub-circuit 1 is disposed in the non-display area, and crisscrossed gate lines and data lines are disposed in the display area. An output terminal of the source driving sub-circuit 1 is coupled to the data line(s) DL.

As shown in FIG. 1 or FIG. 2, the latch circuit 20 includes a resetter 203 and a latch 200. The latch 200 includes at least one stage sub-circuit. In some embodiments, as shown in FIG. 1 or FIG. 2, the latch 200 includes a first stage sub-circuit 201 and a second stage sub-circuit 202.

The first stage sub-circuit 201 is coupled to the shift register circuit 10, a data signal terminal Data and the second stage sub-circuit 202. The first stage sub-circuit 201 is configured to receive a signal output from the shift register circuit 10, latch data signal(s) provided from the data signal terminal Data under the control of a signal output from the shift register circuit 10, and output the data signal(s) to the second stage sub-circuit 202.

The second stage sub-circuit 202 is coupled to data line(s) DL. The second stage sub-circuit 202 is configured to latch the data signal(s) output from the first stage sub-circuit 201 and output the data signal(s) to the data line(s) DL.

In this case, since the second stage sub-circuit 202 is coupled to the data line(s) DL, an output terminal of the second stage sub-circuit 202 may serve as an output terminal of the source driving sub-circuit 1.

It will be noted that, as the resolution of a display device continues to increase, the number of data lines DL in the display panel is also greatly increased. In this case, in order to save a wiring space of the non-display area, the source driving sub-circuit 1 may be coupled to a plurality of data lines DL. Based on this, in order to ensure that each of the plurality of data lines DL coupled to a same source driving sub-circuit 1 can receive a correct data signal, the shift register circuit 10 in the source driving sub-circuit 1 may output a control signal to the first stage sub-circuit 201, so that under the control of the control signal, the second stage sub-circuit 202 can output corresponding data signals to each of the data lines DL one by one, which are coupled to the second stage sub-circuit 202.

In some embodiments, as shown in FIG. 2, the resetter 203 is coupled to an enabling signal terminal EN, a reset signal terminal RST, and the first stage sub-circuit 201. The resetter 203 is configured to receive a signal provided from the enabling signal terminal EN and a signal provided from the reset terminal RST, and under the control of the signal provided from the enabling signal terminal EN, reset the data signal(s) latched by the first stage sub-circuit 201 through a signal from the reset signal terminal RST.

Figure 3:
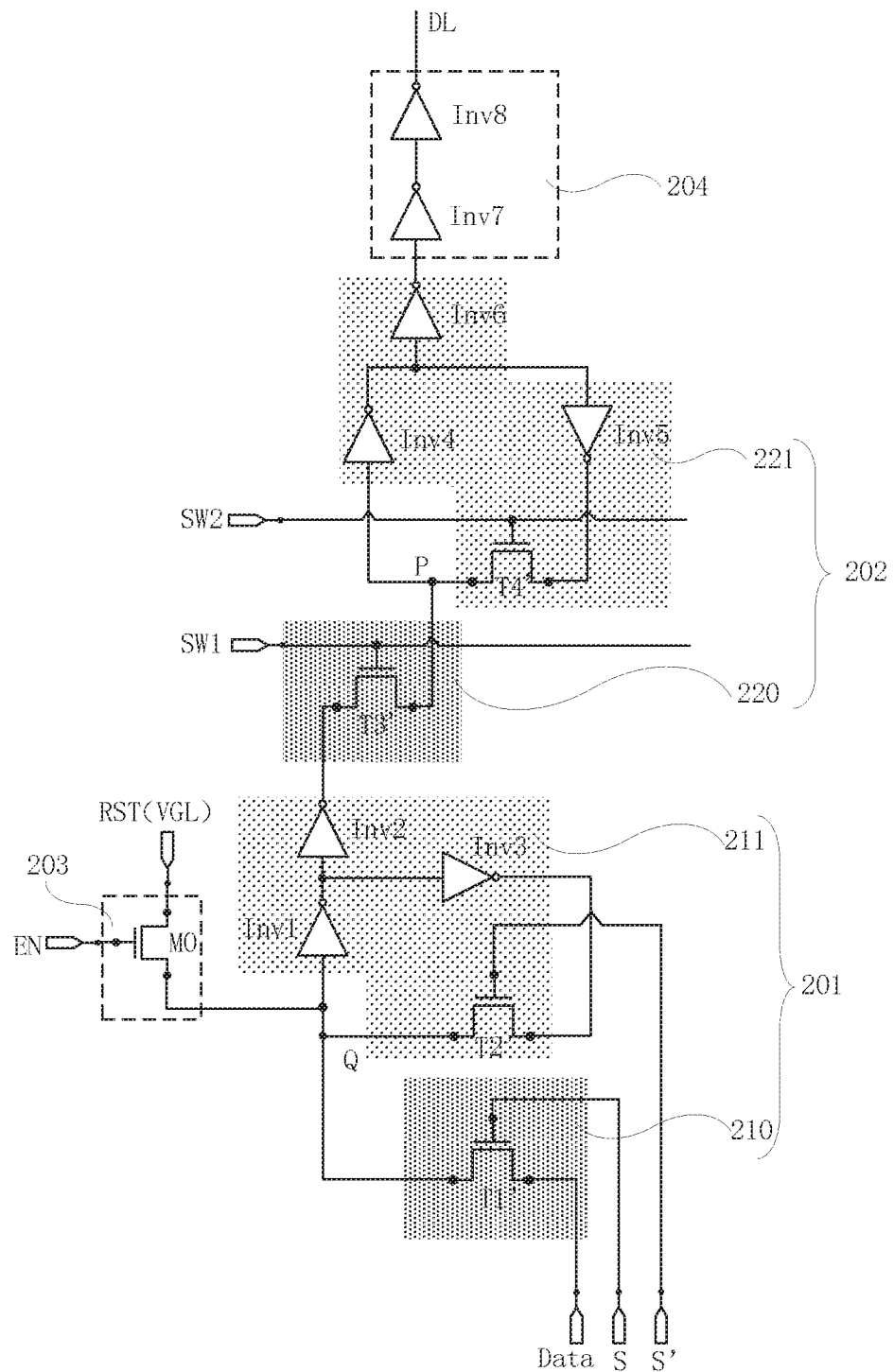
FIG. 3 is a schematic diagram showing a specific structure of the source driving sub-circuit shown in FIG. 2.

In this case, as shown in FIG. 3, the resetter 203 includes a reset transistor M0. The reset transistor M0 includes a gate, a first electrode, and a second electrode. The gate of the reset transistor M0 is coupled to the enabling signal terminal EN, the first electrode of the reset transistor M0 is coupled to the reset signal terminal RST, and the second electrode of the reset transistor M0 is coupled to the first stage sub-circuit 201.

In some other embodiments, as shown in FIG. 1, the resetter 203 is coupled to the enabling signal terminal EN, the reset signal terminal RST, and the second stage sub-circuit 202. The resetter 203 is configured to receive a signal provided from the enabling signal terminal EN and a signal provided from the reset terminal RST, and under the control of the signal provided from the enabling signal terminal EN, reset the data signal(s) latched by the second stage sub-circuit 202 through the signal from the reset signal terminal RST.

Figure 4:
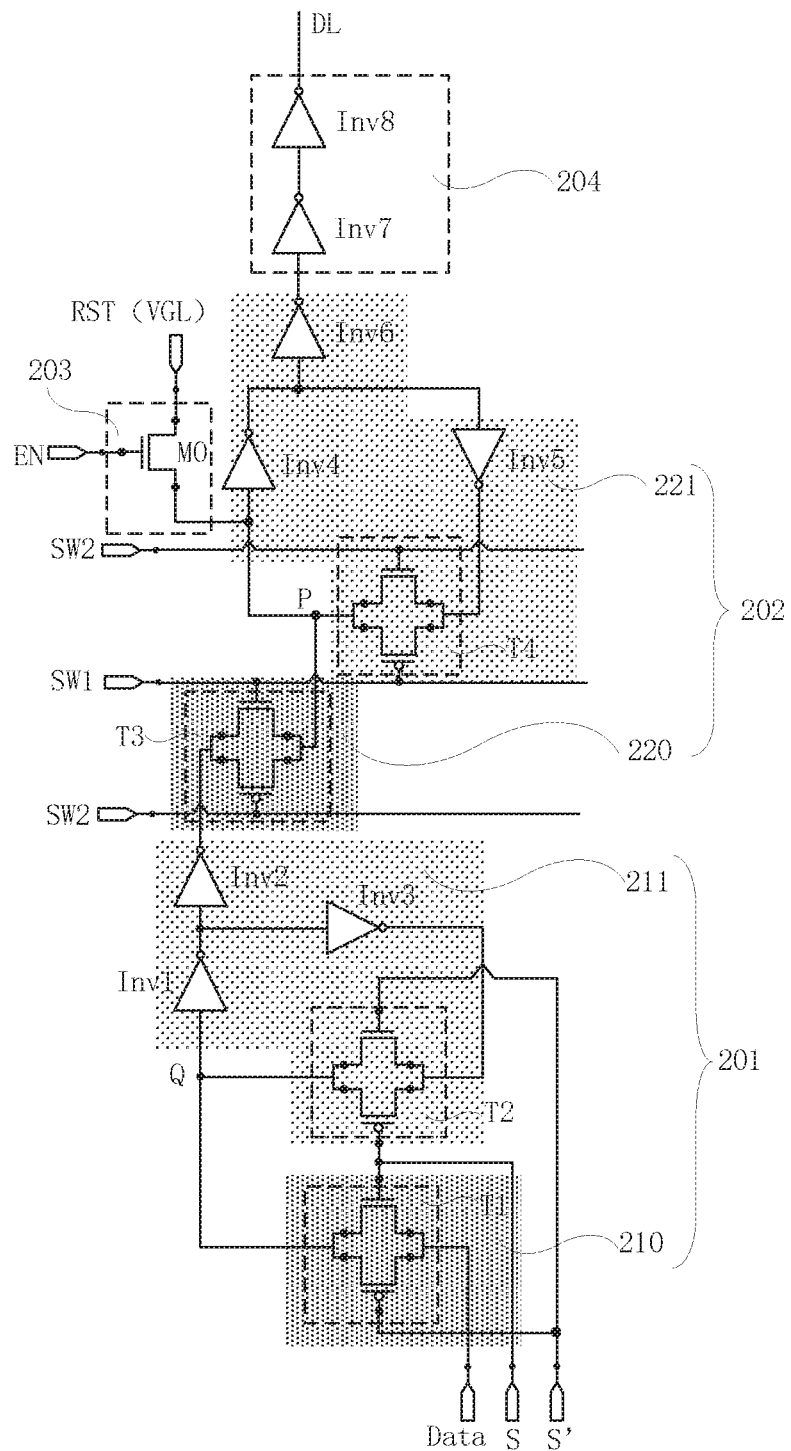
FIG. 4 is a schematic diagram showing a specific structure of the source driving sub-circuit shown in FIG. 1.

In this case, as shown in FIG. 4, the resetter 203 includes a reset transistor M0. The reset transistor M0 includes a gate, a first electrode, and a second electrode. The gate of the reset transistor M0 is coupled to the enabling signal terminal EN, the first electrode of the reset transistor M0 is coupled to the reset signal terminal RST, and the second electrode of the reset transistor M0 is coupled to the second stage sub-circuit 202.

It will be noted that, in some other embodiments, the resetter 203 further includes a plurality of reset transistors M0 coupled in parallel.

In addition, in some embodiments, the reset transistor(s) M0 are N-type transistor(s). In some other embodiments, the reset transistor(s) M0 are P-type transistor(s). For convenience, the following description will be made by taking an example in which the reset transistor M0 is an N-type transistor.

In some embodiments, the first electrode of the reset transistor M0 is a source and the second electrode of the reset transistor M0 is a drain. In some other embodiments, the first electrode of the reset transistor M0 is a drain and the second electrode of the reset transistor M0 is a source.

In summary, the resetter 203 is configured to receive a signal provided from the enabling signal terminal EN and a signal provided from the reset terminal RST, and under the control of the signal provided from the enabling signal terminal EN, reset the data signal(s) latched by the first stage sub-circuit 201 or the data signal(s) latched by the second stage sub-circuit 202 through the signal from the reset signal terminal RST.

As can be seen from the above description, the first stage sub-circuit 201 is coupled to the second stage sub-circuit 202, and the output terminal of the second stage sub-circuit 202 may be coupled to the data line(s) DL as the output terminal of the source driving sub-circuit 1. Therefore, before the source driving sub-circuit 1 transmitting data signals to a next row of sub-pixels to the data lines DL coupled thereto, the data signals latched in the first stage sub-circuit 201 or the second stage sub-circuit 202 are reset by the resetter 203 in the source driving sub-circuit 1, and residual data signals from a previous row of sub-pixels on the data lines DL coupled to the output terminal of the second stage sub-circuit 202 can be cleared. Thereby, the data signals from the next row of sub-pixels may be correctly written to solve a problem of the residual data signals on the data lines DL.

In addition, since the residual data signal(s) on the data line(s) DL may cause the display device to have an afterimage during a display process or after startup, the source driving sub-circuit 1 provided by some embodiments of the present disclosure may solve the problem of the residual data signal(s) on the data line(s) DL. Therefore, a probability of an occurrence of an afterimage phenomenon may be reduced.

Specific structures of the first stage sub-circuit 201, the second stage sub-circuit 202, and the resetter 203 in the latch circuit 20 will be described in detail below.

In some embodiments, as shown in FIG. 3 and FIG. 4, the first stage sub-circuit 201 includes a first transmission sub-circuit 210 and a first latch sub-circuit 211.

As shown in FIG. 3, the first transmission sub-circuit 210 is coupled to a first control signal terminal S of the shift register circuit 10, the data signal terminal Data and a first latch node Q. Or, as shown in FIG. 4, the first transmission sub-circuit 210 is coupled to the first control signal terminal S and a second control signal terminal S' of the shift register circuit 10, the data signal terminal Data and the first latch node Q.

It will be noted that, a signal provided from the first control signal terminal S of the shift register circuit 10 and a signal provided from the second control signal terminal S' of the shift register circuit 10 are opposite. That is, in a case where a signal provided from the first control signal terminal S is at high level, correspondingly, a signal provided from the second control signal terminal S' is at low level; vice versa, in a case where a signal provided from the first control signal terminal S is at low level, correspondingly, a signal provided from the second control signal terminal S' is at high level.

The first transmission sub-circuit 210 is configured to receive a signal provided from the first control signal terminal S of the shift register circuit 10 and data signal(s), and data signal(s) provided from the data signal terminal Data, transmit the received data signal(s) to the first latch node Q at least under the control of the signal from the first control signal terminal S of the shift register circuit 10.

On this basis, as shown in FIG. 3, the first latch sub-circuit 211 is coupled to the first latch node Q, the second stage sub-circuit 202 and the second control signal terminal S' of the shift register circuit 10. Or, as shown in FIG. 4, the first latch sub-circuit 211 is coupled to the first latch node Q, the second stage sub-circuit 202 and the first control signal terminal S and the second control signal terminal S' of the shift register circuit 10.

The first latch sub-circuit 211 is configured to receive a signal provided from the second control signal terminal S' of the shift register circuit 10, and latch data signal(s) from the first latch node Q and output the data signal(s) to the second stage sub-circuit 202 at least under the control of the signal from the second control signal terminal S' of the shift register circuit 10.

As shown in FIG. 3 and FIG. 4, the second stage sub-circuit 202 includes a second transmission sub-circuit 220 and a second latch sub-circuit 221.

As shown in FIG. 3, the second transmission sub-circuit 220 is coupled to the first stage sub-circuit 201, a first turn-on signal terminal SW1 and a second latch node P. Or, as shown in FIG. 4, the second transmission sub-circuit 220 is coupled to the first stage sub-circuit 201, the first turn-on signal terminal SW1, a second turn-on signal terminal SW2, and the second latch node P.

The second transmission sub-circuit 220 is configured to receive a signal provided from the first turn-on signal terminal SW1, and transmit data signal(s) output from the first stage sub-circuit 201 to the second latch node P at least under the control of the signal from the first turn-on signal terminal SW1.

On this basis, as shown in FIG. 3, the second latch sub-circuit 221 is coupled to the second latch node P and the second turn-on signal terminal SW2. Or, as shown in FIG. 4, the second latch sub-circuit 221 is coupled to the second latch node P, the first turn-on signal terminal SW1 and the second turn-on signal terminal SW2.

The second latch sub-circuit 221 is configured to receive a signal provided from the second turn-on signal terminal SW2, latch data signal(s) from the second latch node P at least under the control of the signal provided from the second turn-on signal terminal SW2, and output the data signal(s).

Structures of the first transmission sub-circuit 210 and the first latch sub-circuit 211 in the first stage sub-circuit 201 will be described in detail below.

In some embodiments, as shown in FIG. 3, the first transmission sub-circuit 210 includes a first transmission transistor T1'. The first transmission transistor T1' includes a gate, a first electrode, and a second electrode. The gate of the first transmission transistor T1' is coupled to the first control signal terminal S of the shift register circuit 10, the first electrode of the first transmission transistor T1' is coupled to the data signal terminal Data, and the second electrode of the first transmission transistor T1' is coupled to the first latch node Q.

Under the control of a signal from the first control signal terminal S of the shift register circuit 10, the first transmission transistor T1' is turned on, and the data signal(s) provided from the data signal terminal Data are output to the first latch node Q through the first transmission transistor T1'.

On this basis, as shown in FIG. 3, the first latch sub-circuit 211 includes a second transmission transistor T2', a first inverter Inv1, a second inverter Inv2 and a third inverter Inv3.

The second transmission transistor T2' includes a gate, a first electrode, and a second electrode. The gate of the second transmission transistor T2' is coupled to the second control signal terminal S' of the shift register circuit 10, the first electrode of the second transmission transistor T2' is coupled to an output terminal of the third inverter Inv3, and the second electrode of the second transmission transistor T2' is coupled to the first latch node Q.

The first inverter Inv1 includes an input terminal and an output terminal. The input terminal of the first inverter Inv1 is coupled to the first latch node Q, and the output terminal of the first inverter Inv1 is coupled to an input terminal of the third inverter Inv3 and an input terminal of the second inverter Inv2.

An output terminal of the second inverter Inv2 is coupled to the second stage sub-circuit 202.

In some other embodiments, in a case where the first transmission sub-circuit 210 is coupled to both the first control signal terminal S and the second control signal terminal S' of the shift register circuit 10, the first transmission sub-circuit 210, as shown in FIG. 4, includes a first transmission gate T1. The first transmission gate T1 includes an input terminal, an output terminal, a first control terminal and a second control terminal. The input terminal of the first transmission gate T1 is coupled to the data signal terminal Data, the first control terminal and the second control terminal of the first transmission gate T1 are respectively coupled to the first control signal terminal S and the second control signal terminal S' of the shift register circuit 10, and the output terminal of the first transmission gate T1 is coupled to the first latch node Q.

In some embodiments, the first transmission gate T1 includes two transistors, one of which is an N-type transistor and another of which is a P-type transistor. Under the control of the signals from the first control signal terminal S and the second control signal terminal S' of the shift register circuit 10 respectively, the two transistors in the first transmission gate T1 are turned on, and the data signal(s) provided from the data signal terminal Data are output to the first latch node Q through the first transmission gate T1.

On this basis, as shown in FIG. 4, the first latch sub-circuit 211 includes a second transmission gate T2, the first inverter Inv1, the second inverter Inv2 and the third inverter Inv3.

The second transmission gate T1 includes an input terminal, an output terminal, a first control terminal and a second control terminal. The input terminal of the second transmission gate T2 is coupled to the output terminal of the third inverter Inv3, the first control terminal and the second control terminal of the second transmission gate T2 are respectively coupled to the first control signal terminal S and the second control signal terminal S' of the shift register circuit 10, and the output terminal of the second transmission gate T2 is coupled to the first latch node Q.

As shown in FIG. 4, the input terminal of the first inverter Inv1 is coupled to the first latch node Q, and the output terminal of the first inverter Inv1 is coupled to the input terminal of the third inverter Inv3 and the input terminal of the second inverter Inv2.

The output terminal of the second inverter Inv2 is coupled to the second stage sub-circuit 202.

It will be seen from this that, as shown in FIG. 4, the first stage sub-circuit 201 includes two transmission gates (T1 and T2) and three inverters (Inv1, Inv2 and Inv3), and thus the structure of the first stage sub-circuit 201 is simple and a wiring space occupied is small.

Figure 5A:
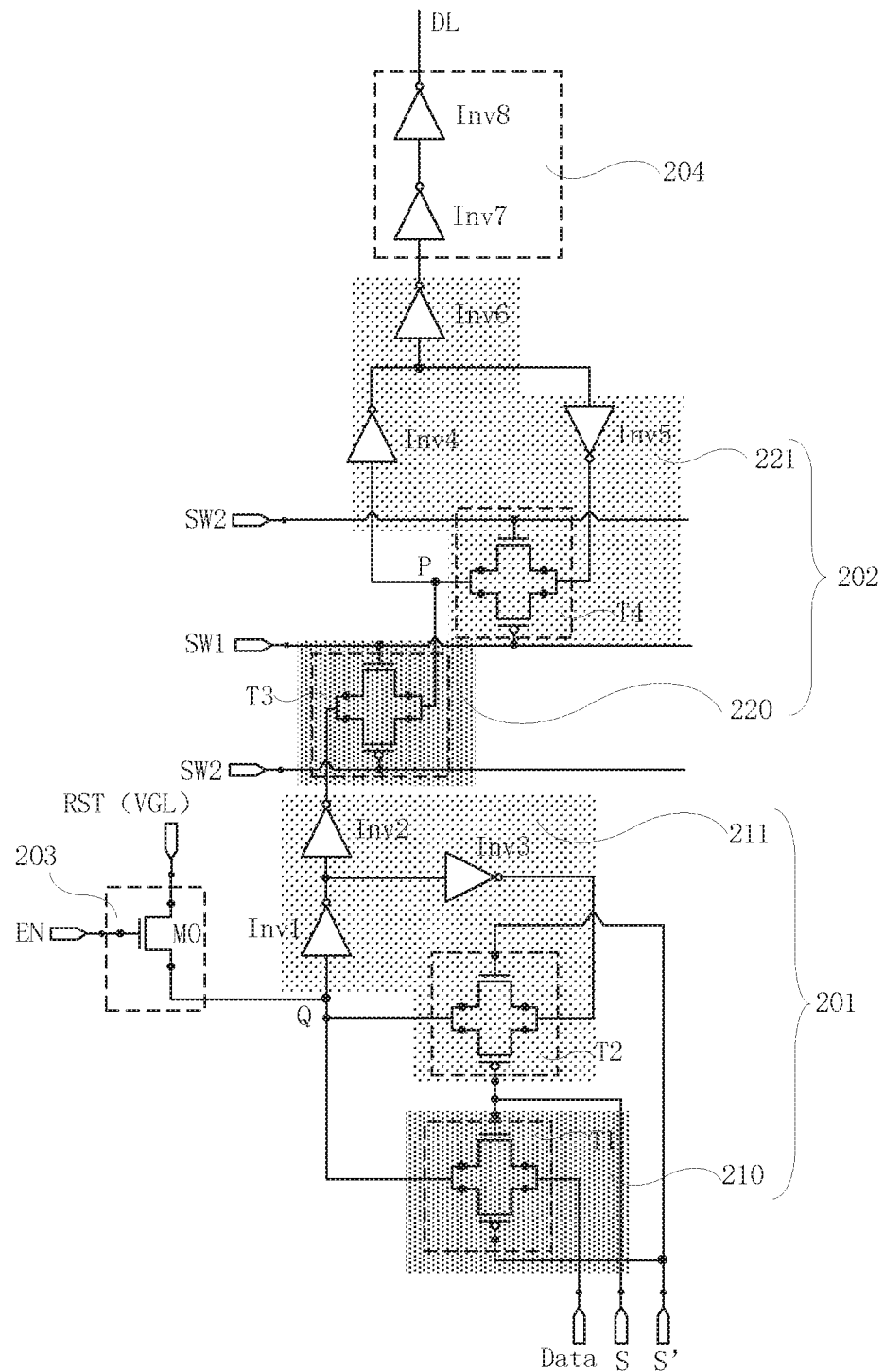
FIG. 5a is a schematic diagram showing another specific structure of the source driving sub-circuit shown in FIG. 2.

In some embodiments, in a case where the resetter 203 is coupled to the first stage sub-circuit 201 and the resetter 203 includes the reset transistor M0 (as shown in FIG. 5a), the second electrode of the reset transistor M0 is coupled to the input terminal of the first inverter Inv1. The reset signal terminal coupled to the first electrode of the reset transistor M0 is a first voltage terminal VGL.

The first voltage terminal VGL outputs a low level. In this way, after the reset transistor M0 is turned on, the signal(s) from the first latch node Q can be pulled down to a potential of the first voltage terminal VGL through the reset transistor M0, thereby clearing the data signal(s) latched on the first latch node Q.

Figure 5B:
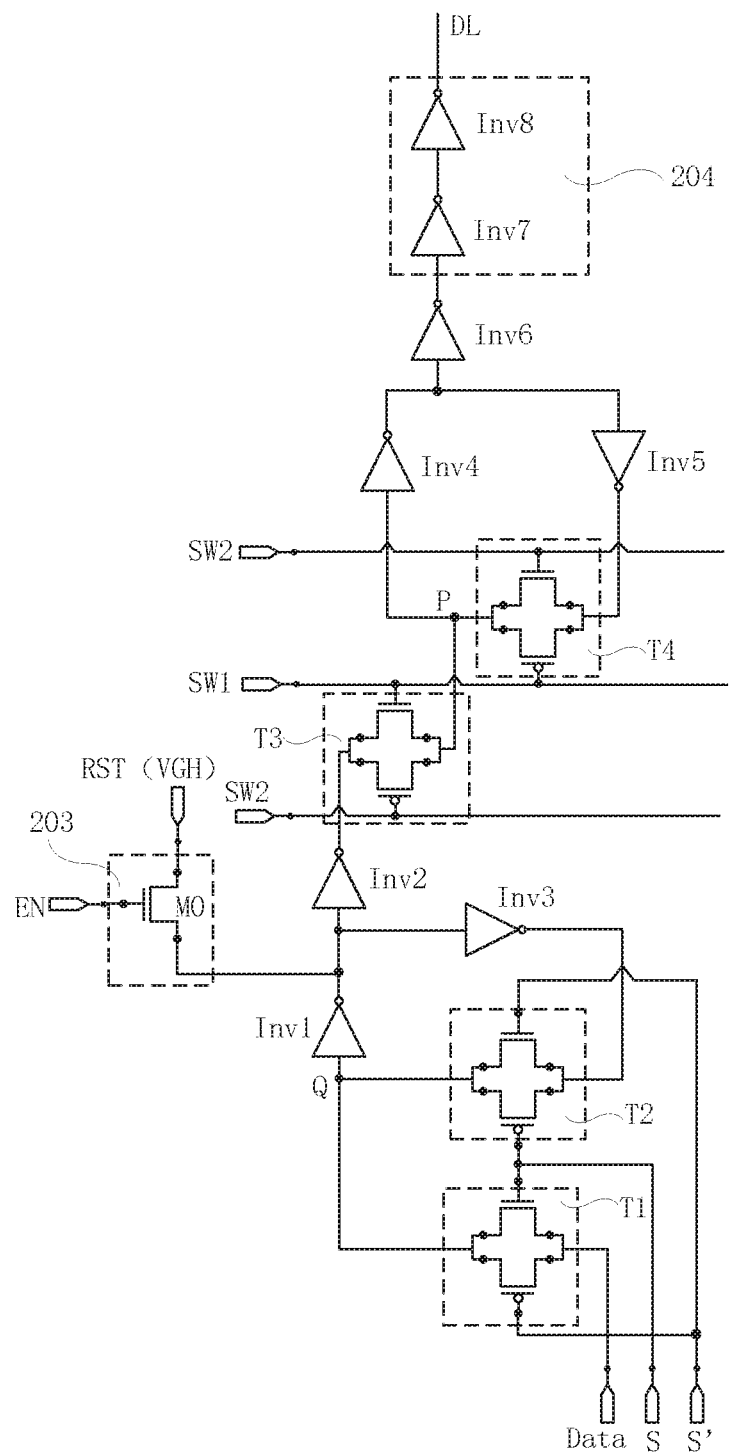
FIG. 5b is a schematic diagram showing another specific structure of the source driving sub-circuit shown in FIG. 2.

In some embodiments, a connection mode of the reset transistor M0 is as shown in FIG. 5b. The second electrode of the reset transistor M0 is coupled to the output terminal of the first inverter Inv1. The reset signal terminal RST coupled to the first electrode of the reset transistor M0 is a second voltage terminal VGH.

The second voltage terminal VGH outputs a high level. In this way, a potential of the output terminal of the first inverter Inv1 is pulled up to a potential of the second voltage terminal VGH through the reset transistor M0. Since a potential of the output terminal of the first inverter Inv1 is at high level, a potential input to the first latch node through the second transmission gate T2 is at low level under an action of the third inverter Inv3. In this case, the potential of the first latch node Q coupled to the input terminal of the first inverter Inv1 is pulled down, thereby clearing the data signal(s) latched on the first latch node Q.

It will be noted that, in a case where the latch circuit 20 includes a single stage sub-circuit, the single stage sub-circuit is coupled to the shift register circuit 10 and the data signal terminal Data. The single stage sub-circuit is configured to receive signals output from the shift register circuit 10 and data signal(s) provided from the data signal terminal Data, latch the received data signal(s) under the control of the signals output from the shift register circuit 10, and output the data signal(s) to the data line(s) DL. In this case, the single stage sub-circuit has a structure of the first stage sub-circuit 201 as shown in FIG. 3 or FIG. 4 or FIG. 5a or FIG. 5b. That is, in a case where the single stage sub-circuit is the first stage sub-circuit 201 as shown in FIG. 4 or FIG. 5a or FIG. 5b, the single stage sub-circuit includes the first transmission gate T1, the second transmission gate T2, the first inverter Inv1, the second inverter Inv2 and the third inverter Inv3. In a case where the single stage sub-circuit is the first stage sub-circuit 201 as shown in FIG. 3, the single stage sub-circuit includes the first transmission transistor T1', the second transmission transistor T2', the first inverter Inv1, the second inverter Inv2 and the third inverter Inv3. On this basis, the reset transistor M0 is coupled to the input terminal or the output terminal of the first inverter Inv1.

Structures of the second transmission sub-circuit 220 and the second latch sub-circuit 221 in the second stage sub-circuit 202 will be described in detail below.

In some embodiments, as shown in FIG. 3, the second transmission sub-circuit 220 includes a third transmission transistor T3'. The third transmission transistor T3' includes a gate, a first electrode, and a second electrode. The gate of the third transmission transistor T3' is coupled to the first turn-on signal terminal SW1, the first electrode of the third transmission transistor T3' is coupled to the first stage sub-circuit 201, and the second electrode of the third transmission transistor T3' is coupled to the second latch node P.

On this basis, as shown in FIG. 3, the second latch sub-circuit 221 includes a fourth transmission transistor T4', a fourth inverter Inv4, a fifth inverter Inv5 and a sixth inverter Inv6.

The fourth transmission transistor T4' includes a gate, a first electrode, and a second electrode. The gate of the fourth transmission transistor T4' is coupled to the second turn-on signal terminal SW2, the first electrode of the fourth transmission transistor T4' is coupled to an output terminal of the fifth inverter Inv5, and the second electrode of the fourth transmission transistor T4' is coupled to the second latch node P.

An input terminal of the fourth inverter Inv4 is coupled to the second latch node P, and an output terminal of the fourth inverter Inv4 is coupled to an input terminal of the fifth inverter Inv5 and an input terminal of the sixth inverter Inv6.

An output terminal of the sixth inverter Inv6 is the output terminal of the second stage sub-circuit 202.

In some other embodiments, as shown in FIG. 4, the second transmission sub-circuit 220 includes a third transmission gate T3. The third transmission gate T3 includes an input terminal, an output terminal, a first control terminal and a second control terminal. The input terminal of the third transmission gate T3 is coupled to the first stage sub-circuit 201, the first control terminal and the second control terminal of the third transmission gate T3 are respectively coupled to the first turn-on signal terminal SW1 and the second turn-on signal terminal SW2, and the output terminal of the third transmission gate T3 is coupled to the second latch node P.

Figure 6:
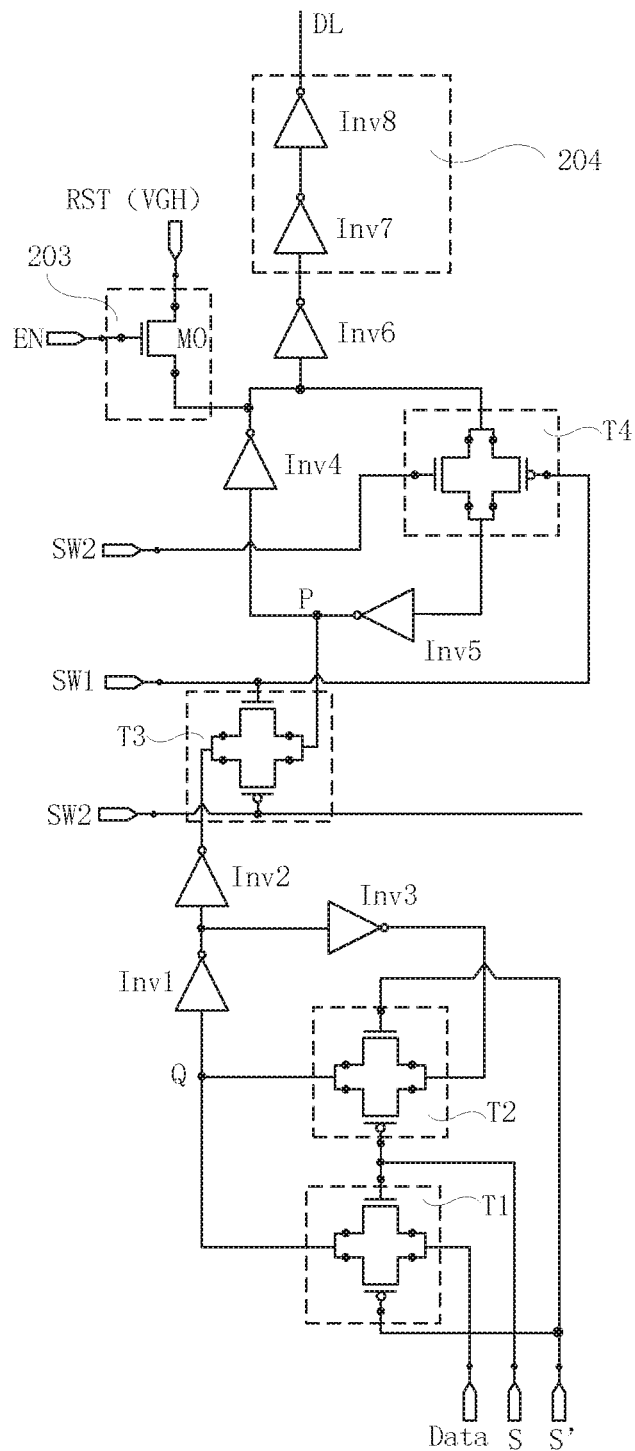
FIG. 6 is a schematic diagram showing another specific structure of the source driving sub-circuit shown in FIG. 1.

On this basis, as shown in FIG. 4 and FIG. 6, the second latch sub-circuit 221 includes a fourth transmission gate T4, a fourth inverter Inv4, a fifth inverter Inv5 and a sixth inverter Inv6.

The fourth transmission gate T4 includes an input terminal, an output terminal, a first control terminal and a second control terminal. In some embodiments, a connection mode of the fourth transmission gate T4 may be as shown in FIG. 4, the first control terminal and the second control terminal of the fourth transmission gate T4 are respectively coupled to the first turn-on signal terminal SW1 and the second turn-on signal terminal SW2, the input terminal of the fourth transmission gate T4 is coupled to the output terminal of the fifth inverter Inv5, and the output terminal of the fourth transmission gate T4 is coupled to the second latch node P.

The input terminal of the fourth inverter Inv4 is coupled to the second latch node P, and the output terminal of the fourth inverter Inv4 is coupled to the input terminal of the fifth inverter Inv5 and the input terminal of the sixth inverter Inv6.

The output terminal of the sixth inverter Inv6 is used as the output terminal of the second stage sub-circuit 202.

In some other embodiments, a connection mode of the fourth transmission gate T4 may also be as shown in FIG. 6. The input terminal of the fourth transmission gate T4 is coupled to the output terminal of the fourth inverter Inv4, the output terminal of the fourth transmission gate T4 is coupled to the input terminal of the fifth inverter Inv5, and the first control terminal and the second control terminal of the fourth transmission gate T4 are respectively coupled to the first turn-on signal terminal SW1 and the second turn-on signal terminal SW2.

Based on this, in a case where the fourth transmission gate T4 adopts any one of the two connection modes, when the first stage sub-circuit 201 transmits the latched data signal(s) to the second latch node P through the third transmission gate T3 in the second stage sub-circuit 202, if the fourth transmission gate T4 is controlled to be turned off through signals from the first turn-on signal terminal SW1 and the second turn-on signal terminal SW2, the second latch node P, the fourth inverter Inv4, the fifth inverter Inv5 and the fourth transmission gate T4 cannot form a loop (as shown in FIGS. 3 to 5b, a transmission direction of signal in the loop is: P→Inv4→Inv5→T4→P; or as shown in FIG. 6, a transmission direction of signal in the loop is: P→Inv4→T4→Inv5→P). In this case, even if driving capabilities of the third transmission gate T3 and the fourth transmission gate T4 are insufficient, the data signal(s) from the first latch node Q may also be transmitted to the second latch node P.

Figure 7:
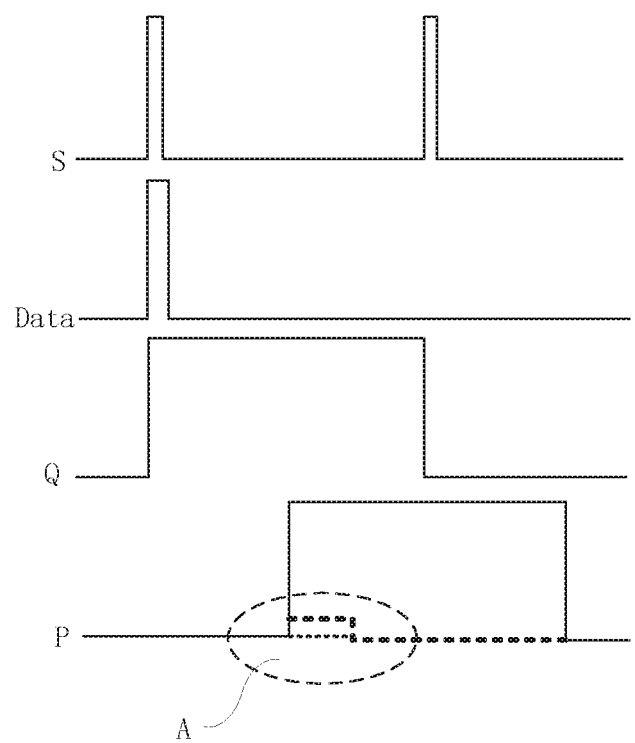
FIG. 7 is a diagram showing timings of signals output from a source driving sub-circuit, in accordance with some embodiments of the present disclosure.

In this way, a problem that when the first stage sub-circuit 201 transmits data to the second stage sub-circuit 202, a presence of the above loop causes the data signal(s) to be unable to be normally input, thereby causing an abnormal conduction (at the portion A) as shown in FIG. 7 of a signal from the second latch node P to appear may be avoided. For example, if in the previous stage(s), signal(s) provided from the second latch node P is at low level, in this case, in the next stage, when signal(s) to be transmitted on the second latch node P is at high level, due to the presence of the loop, the signal(s) at high level cannot be normally transmitted to the second latch node P, thereby causing an abnormality in the signal(s) of the second latch node P. In addition, since when the first stage sub-circuit 201 transmits the data to the second stage sub-circuit 202, the above loop will not be formed inside the second stage sub-circuit 202, requirements for the driving capabilities of the third transmission gate T3 and the fourth transmission gate T4 are not high, and thus sizes of the third transmission gate T3 and the fourth transmission gate T4 do not need to be increased, which is advantageous for reducing areas of wiring spaces occupied.

It will be noted that, after the data signal(s) from the first latch node Q is transmitted to the second latch node P, the third transmission gate T3 can be controlled to be turned off and the fourth transmission gate T4 can be controlled to be turned on through the first turn-on signal terminal SW1 and the second turn-on signal terminal SW2, thereby forming the above loop (as shown in FIGS. 3 to 5b, a transmission direction of signal in the loop is: P→Inv4→Inv5→T4→P; or as shown in FIG. 6, a transmission direction of signal in the loop is; P→Inv4→T4→Inv5→P), so that the data signal(s) are latched in the second stage sub-circuit 202.

In some embodiments, in a case where the resetter 203 is coupled to the second stage sub-circuit 202 and the resetter 203 includes the reset transistor M0, as shown in FIG. 4, the second electrode of the reset transistor M0 is coupled to the input terminal of the fourth inverter Inv4. In this case, the reset signal terminal RST coupled to the first electrode of the reset transistor M0 is the first voltage terminal VGL.

After the reset transistor M0 is turned on, the signal(s) from the second latch node P are pulled down to a potential of the first voltage terminal VGL through the reset transistor M0, thereby clearing the data signal(s) latched on the second latch node P. Since the second stage sub-circuit 202 to which the second latch node P belongs is coupled to the data line(s) DL, in a process of clearing the data signal(s) latched on the second latch node P, the residual data signal(s) on the data line(s) DL may also be cleared. Thereby, it is not necessary to input data signal(s) corresponding to a black image row by row to sub-pixels, and a rapid discharge of an active display area (AA) is achieved. Further, it is possible to prevent the afterimage from appearing during the startup or a normal display of the display device.

In some other embodiments, in the case where the resetter 203 is coupled to the second stage sub-circuit 202 and the resetter 203 includes the reset transistor M0, the second electrode of the reset transistor M0 is coupled to the output terminal of the fourth inverter Inv4 (as shown in FIG. 6). In this case, the reset signal terminal RST coupled to the first electrode of the reset transistor M0 is the second voltage terminal VGH.

In this way, a potential of the output terminal of the fourth inverter Inv4 is pulled up to a potential of the second voltage terminal VGH through the reset transistor M0. Since the a potential of output terminal of the fourth inverter Inv4 is at high level, a potential input to the second latch node P through the fourth transmission gate T4 is at low level under an action of the fifth inverter Inv5. In this case, the potential on the second latch node P coupled to the input terminal of the fourth inverter Inv4 is pulled down, thereby clearing the data signal(s) latched on the second latch node P. In addition, when a potential of the output terminal of the fourth inverter Inv4 is at high level, the second stage sub-circuit 202 outputs low level(s) to the data line(s) DL through a reverse action of the sixth inverter Inv6 to clear the residual signals on the data lines DL. Finally, purposes of preventing the residual signal(s) on the data line(s) DL and rapid discharging of the active display area are achieved.

It will be noted that, in a case where the latch circuit 20 includes a single stage sub-circuit, the single stage sub-circuit may have a structure of the second stage sub-circuit 202 as shown in FIG. 3 or FIG. 4 or FIG. 6. That is, in a case where the single stage sub-circuit is the second stage sub-circuit 202 as shown in FIG. 4 or FIG. 6, the single stage sub-circuit includes the third transmission gate T3, the fourth transmission gate T4, the fourth inverter Inv4, the fifth inverter Inv5 and the sixth inverter Inv6. In a case where the single stage sub-circuit is the second stage sub-circuit 202 as shown in FIG. 3, the single stage sub-circuit includes the third transmission transistor T3', the fourth transmission transistor T4', the fourth inverter Inv4, the fifth inverter Inv5 and the sixth inverter Inv6. In this case, the reset transistor M0 is coupled to the input terminal or the output terminal of the fourth inverter Inv4.

In the case where the single stage sub-circuit is the second stage sub-circuit 202, in order to couple the single stage sub-circuit to the shift register circuit 10 and the data signal terminal Data, the input terminal of the third transmission gate T3 (or the first electrode of the third transmission transistor T3') is coupled to the data signal terminal Data, and the first turn-on signal terminal SW1 and the second turn-on signal terminal SW2 are respectively coupled to the first control signal terminal S and the second control signal terminal S' of the shift register circuit 10.

In some embodiments, as shown in FIG. 6, the latch circuit 20 further includes a buffer 204. The buffer 204 includes a seventh inverter Inv7 and an eighth inverter Inv8. The buffer 204 is configured to buffer the data signal(s) output from the second stage sub-circuit 202.

The seventh inverter Inv7 includes an input terminal and an output terminal. The input terminal of the seventh inverter Inv7 is coupled to the output terminal of the second stage sub-circuit 202, and the output terminal of the seventh inverter Inv7 is coupled to an input terminal of the eighth inverter Inv8.

An output terminal of the eighth inverter Inv8 is used as the output terminal of the source driving sub-circuit 1. In this case, the output terminal of the eighth inverter Inv8 may be coupled to the data line(s) DL.

Figure 8:
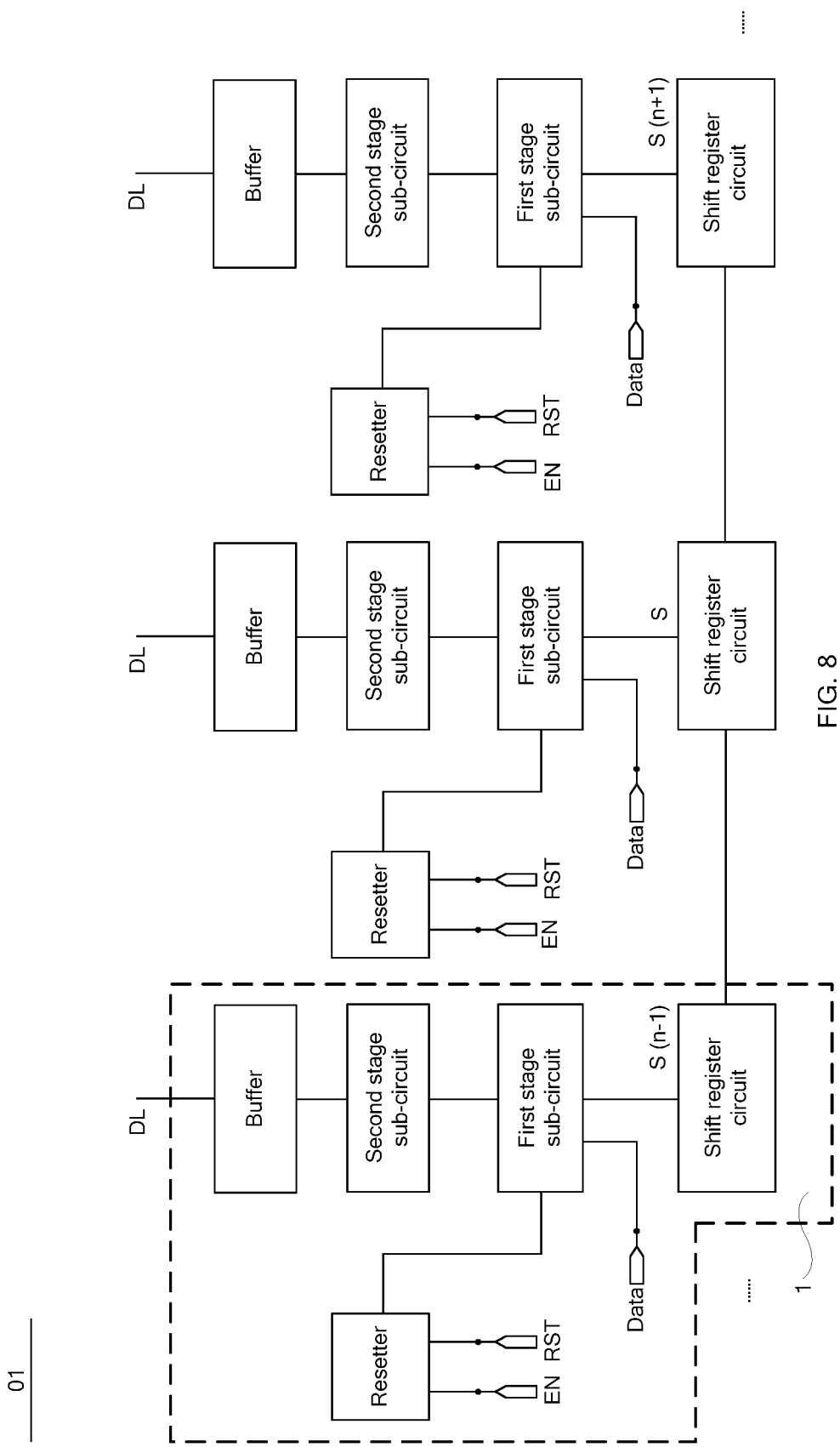
FIG. 8 is a schematic diagram showing a structure of a source driving circuit, in accordance with some embodiments of the present disclosure.

Some embodiments of the present disclosure further provide a source driving circuit 01. As shown in FIG. 8, the source driving circuit 01 includes a plurality of above source driving sub-circuits 1 arranged side by side. The shift register circuits 10 in the plurality of source driving sub-circuits 1 are cascaded in sequence.

The source driving circuit 01 has same technical effects as the source driving sub-circuit 1, and details are not described herein again.

Figure 9:
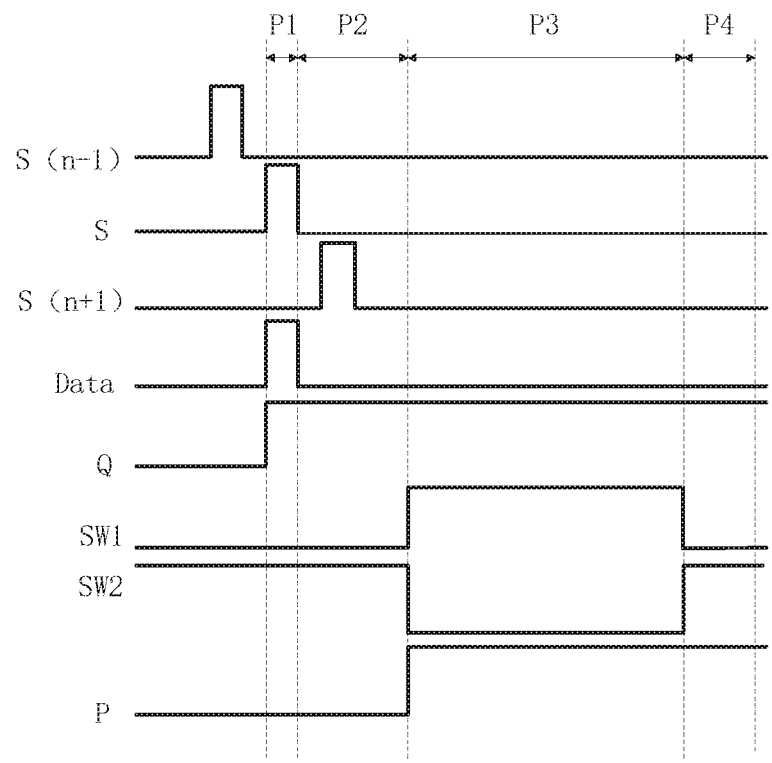
FIG. 9 is another diagram showing timings of signals output from a source driving sub-circuit, in accordance with some embodiments of the present disclosure.

It will be noted that, a signal provided from a first control signal output terminal S of one stage shift register circuit 10 is as shown in FIG. 9, and also indicated as S, a signal provided from a first control signal output terminal S of a previous stage shift register circuit 10 corresponding to this stage shift register circuit 10 is indicated as S(n−1), and a signal provided from a first control signal output terminal S of a next stage shift register circuit 10 corresponding to this stage shift register circuit 10 is indicated as S(n+1).

Figure 10:
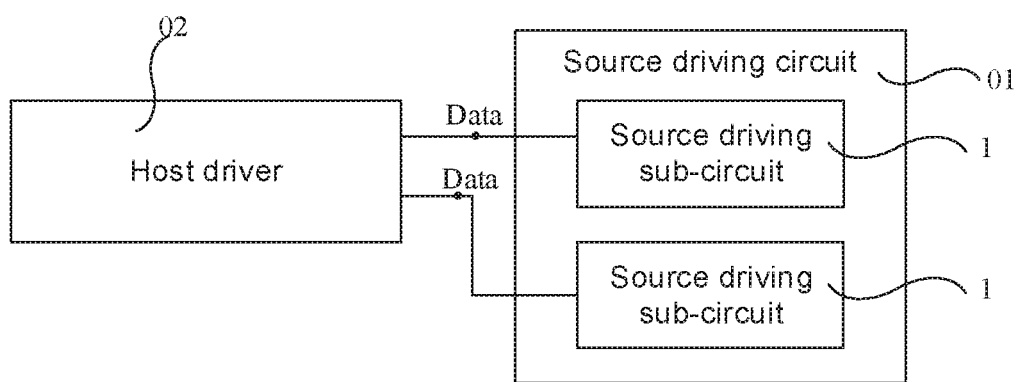
FIG. 10 is a schematic diagram of a display device, in accordance with some embodiments of the present disclosure.

Some embodiments of the present disclosure provide a display device. As shown in FIG. 10, the display device includes a host driver 02 and the source driving circuit 01 described above. The host driver 02 is coupled to the source driving sub-circuits 1 of the source driving circuit 01 through data signal terminals Data. The display device has the same technical effects as the above source driving circuit 01, and details are not described herein again.

It will be noted that, in some embodiments of the present disclosure, the display device may specifically include at least a liquid crystal display device or an organic light-emitting diode display device. For example, the display device may be any product or component having a display function such as a display, a television, a digital photo frame, a mobile phone or a tablet computer.

Figure 11:
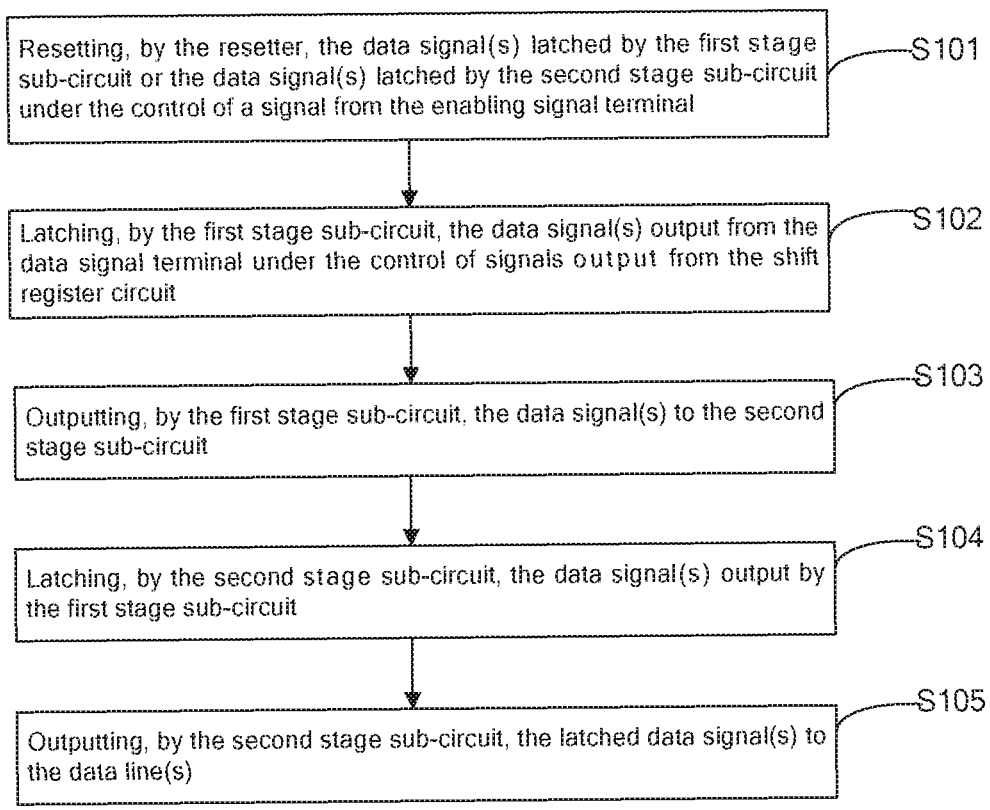
FIG. 11 is a flow diagram of a method of driving a source driving sub-circuit, in accordance with some embodiments of the present disclosure.

Some embodiments of the present disclosure provide a method for driving the above source driving sub-circuit 1. In a case where the latch 200 includes the first stage sub-circuit 201 and the second stage sub-circuit 202, as shown in FIG. 11, the above method includes step 101 (S101):

In S101, resetting, by the resetter 203, the data signal(s) latched by the first stage sub-circuit 201 or the data signal(s) latched by the second stage sub-circuit 202 under the control of a signal from the enabling signal terminal EN.

It will be understood that, in some embodiments, as shown in FIG. 2, the resetter 203 of the source driving sub-circuit 1 is coupled to the first stage sub-circuit 201, in this case, the resetter 203 resets the data signal(s) latched by the first stage sub-circuit 201 under the control of a signal from the enabling signal terminal EN. In some other embodiments, as shown in FIG. 1, the resetter 203 of the source driving sub-circuit 1 is coupled to the second stage sub-circuit 202, in this case, the resetter 203 resets the data signal(s) latched by the second stage sub-circuit 202 under the control of a signal from the enabling signal terminal EN.

In some embodiments, in the case where the resetter 203 includes the reset transistor M0, the step of resetting, by the resetter 203, the data signal(s) latched by the first stage sub-circuit 201 under the control of a signal from the enabling signal terminal EN in S161 described above, includes: as shown in FIG. 3 or FIG. 5a or FIG. 5b, controlling, by the signal from the enabling signal terminal EN, the reset transistor M0 to be turned on, and outputting the signal from the reset signal terminal RST to the first stage sub-circuit 201 through the reset transistor M0.

On this basis, in some embodiments, as shown in FIG. 3 or FIG. 5a, the second electrode of the reset transistor M0 is coupled to the input terminal of the first inverter Inv1. In this case, the reset signal terminal RST is the first voltage terminal VGL. In some other embodiments, as shown in FIG. 5b, the second electrode of the reset transistor M0 is coupled to the output terminal of the first inverter Inv1. In this case, the reset signal terminal RST is the second voltage terminal VGH.

Based on this, the data signal(s) from the first latch node Q are cleared through the reset signal terminal RST. It will be noted that, a process of clearing the data signal(s) from the first latch node Q is as described above, and details are not described herein again.

In some embodiments, in the case where the resetter 203 includes the reset transistor M0, the step of resetting, by the resetter 203, the data signal(s) latched by the second stage sub-circuit 202 under the control of a signal from the enabling signal terminal EN in the S101 described above, includes: as shown in FIG. 4 or FIG. 6, controlling, by the signal from the enabling signal terminal EN, the reset transistor M0 to be turned on, and outputting the signal from the reset signal terminal RST to the second stage sub-circuit 202 through the reset transistor M0.

On this basis, in some embodiments, as shown in FIG. 4, the second electrode of the reset transistor M0 is coupled to the input terminal of the fourth inverter Inv4. In this case, the reset signal terminal RST is the first voltage terminal VGL. In some other embodiments, as shown in FIG. 6, the second electrode of the reset transistor M0 is coupled to the output terminal of the fourth inverter Inv4. In this case, the reset signal terminal RST is the second voltage terminal VGH.

Based on this, data signal(s) on a second latch node P are cleared through the reset signal terminal RST. A process of clearing the data signal(s) on the second latch node P is as described above, and details are not described herein again.

On this basis, in one driving cycle (as shown in FIG. 9, a first period P1, a second period P2, a third period P3, and a fourth period P4 are included), the method further includes step 102 to step 105 (S102-S105):

In S102, latching, by the first stage sub-circuit 201, the data signal(s) provided from the data signal terminal Data under the control of signals (S and S') output from the shift register circuit 10.

In some embodiments, the source driving sub-circuit shown in FIG. 4 is taken as an example. In the first period P1, the first control signal terminal S of the shift register circuit 10 outputs a high level, and the second control signal terminal S' of the shift register circuit 10 outputs a low level, so that the first transmission gate T1 is turned on, and the second transmission gate T2 is turned off. In this way, the data signal (high level, as shown in FIG. 9) provided from the data signal terminal Data is transmitted to the first latch node Q through the first transmission gate T1.

In addition, the first turn-on signal terminal SW1 outputs a low level, the second turn-on signal terminal SW2 outputs a high level, in this way, the third transmission gate T3 is turned off. The data signal(s) from the first latch node Q cannot be transmitted to the second latch node P.

Therefore, the first period P1 is a period in which the data signal terminal Data transmits the data signal(s) to the first stage sub-circuit 201.

On this basis, in the second period P2, the first control signal terminal S of the shift register circuit 10 outputs a low level, and the second control signal terminal S' of the shift register circuit 10 outputs a high level. In this way, the first transmission gate T1 is turned off, the second transmission gate T2 is turned on, the third transmission gate T3 remains in an off state. In this case, the first latch node Q, the first inverter Inv1, the third inverter Inv3, and the second transmission gate T2 form the loop (as shown in FIG. 4, a transmission direction of signal in the loop is: Q→Inv1→Inv3→T2→Q), thereby latching the data signal(s) transmitted from the data signal terminal Data to the first stage sub-circuit 201.

Therefore, the second period P2 is a period of latching the data signal(s) transmitted from the data signal terminal Data to the first stage sub-circuit 201.

In S103, outputting, by the first stage sub-circuit 201, the data signal(s) to the second stage sub-circuit 202.

Herein, the source driving sub-circuit shown in FIG. 4 is still taken as an example. In the third period P3 shown in FIG. 9, the first turn-on signal terminal SW1 outputs a high level, and the second turn-on signal terminal SW2 outputs a low level. In this case, the third transmission gate T3 is turned on, and the fourth transmission gate T4 is turned off. The data signal(s) from the first latch node Q are transmitted to the second latch node P through the third transmission gate T3.

Since the fourth transmission gate T4 is turned off, the second latch node P, the fourth inverter Inv4, the fifth inverter Inv5, and the fourth transfer gate T4 cannot form the loop (as shown in FIG. 4, a transmission direction of signal in the loop is: P→Inv4→Inv5→T4→P). In this case, even if the driving capabilities of the third transmission gate T3 and the fourth transmission gate T4 are insufficient, the data signal(s) from the first latch node Q may also be transmitted to the second latch node P.

Based on this, the third period P3 is a period in which the first stage sub-circuit 201 transmits the data signal(s) to the second stage sub-circuit 202.

In S104, latching, by the second stage sub-circuit 202, the data signal(s) output from the first stage sub-circuit 201.

Herein, the source driving sub-circuit shown in FIG. 4 is still taken as an example. In the fourth period P4 shown in FIG. 9, the first turn-on signal terminal SW1 outputs a low level, and the second turn-on signal terminal SW2 outputs a high level, so that the third transmission gate T3 is turned off, and the fourth transmission gate T4 is turned on. In this case, a data transmission from the first latch reception Q to the second latch node P is interrupted.

In addition, since the fourth transmission gate T4 is turned on, the second latch node Q, the fourth inverter Inv4, the fifth inverter Inv5, and the fourth transmission gate T4 can form the loop (as shown in FIG. 4, a transmission direction of signal in the loop is: P→Inv4→Inv5→T4→P), thereby latching the data signal(s) transmitted from the first stage sub-circuit 201 to the second stage sub-circuit 202.

It will be seen that, the fourth period P4 is a period in which the second stage sub-circuit 202 latches the data signal(s) output from the first stage sub-circuit 201.

In S105, outputting, by the second stage sub-circuit 202, the latched data signal(s) to the data lines DL.

When the gate lines GL in the display panel are turned on row by row, the second stage sub-circuit 202 outputs the latched data signals to the data lines DL coupled to the source driving sub-circuit 1 through the buffer 204, thereby charging the sub-pixels coupled to the data lines DL.

It will be noted that, in a case where the source driving sub-circuit 1 is provided with two-stage sub-circuits, that is, the first stage sub-circuit 201 and the second stage sub-circuit 202, the first stage sub-circuit 201 may store data signals from a previous row of sub-pixels, and the second stage sub-circuit 202 may store data signals from a next row of sub-pixels, thereby improving an efficiency of writing the data signals. In addition, in some display panels, a charging time of a first row of sub-pixels is long, and a charging time of a last row of sub-pixels is short. In the source driving sub-circuit 1 provided by some embodiments of the present disclosure, by setting the above two-stage sub-circuits, a difference in the charging time between the first row of sub-pixels and the last row of sub-pixels may be reduced.

A person of ordinary skill in the art can understand that: all or part of the steps in the method embodiments described above may be implemented by using a program to control related hardware to perform the steps. The foregoing program may be stored in a computer-readable storage medium for executing the steps included in the method embodiments above. The foregoing storage medium includes various media that can store program codes, such as a read-only memory (ROM), a random-access memory (RAM), a magnetic disk, or an optical disk.

The foregoing descriptions are merely some specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A source driving sub-circuit, comprising a shift register circuit and a latch circuit, the shift register circuit being coupled to the latch circuit, wherein
    the latch circuit includes a resetter and a latch;
    the resetter is coupled to an enabling signal terminal, a reset signal terminal and the latch;
    the latch is coupled to the shift register circuit and a data signal terminal;
    the latch is configured to receive signals output from the shift register circuit and at least one data signal provided from the data signal terminal, and latch the received at least one data signal in response to the signals output from the shift register circuit; and
    the resetter is configured to receive a signal provided from the enabling signal terminal and a signal provided from the reset signal terminal, and reset the at least one data signal latched by the latch in response to the signal provided from the enabling signal terminal, wherein
    the latch includes at least one stage sub-circuit, and the at least one stage sub-circuit includes a first stage sub-circuit and a second stage sub-circuit;
    the resetter is coupled to the first stage sub-circuit or the second stage sub-circuit;
    the first stage sub-circuit is coupled to the shift register circuit, the data signal terminal and the second stage sub-circuit;
    the first stage sub-circuit is configured to receive the signals output from the shift register circuit and the at least one data signal provided from the data signal terminal, latch the at least one data signal in response to the signals output from the shift register circuit, and output the at least one data signal to the second stage sub-circuit; and
    the second stage sub-circuit is configured to latch the at least one data signal output from the first stage sub-circuit;
    the resetter includes a reset transistor; and
    a gate of the reset transistor is coupled to the enabling signal terminal, a first electrode of the reset transistor is coupled to the reset signal terminal, and a second electrode of the reset transistor is coupled to the first stage sub-circuit or the second stage sub-circuit.

2. The source driving sub-circuit according to claim 1, wherein the first stage sub-circuit includes a first transmission sub-circuit and a first latch sub-circuit;
    the first transmission sub-circuit is coupled to a first control signal terminal of the shift register circuit, the data signal terminal and a first latch node; and the first transmission sub-circuit is configured to transmit at least one data signal provided from the data signal terminal to the first latch node in response to a signal provided from the first control signal terminal of the shift register circuit; and
    the first latch sub-circuit is coupled to the first latch node, the second stage sub-circuit and a second control signal terminal of the shift register circuit; and the first latch sub-circuit is configured to latch the at least one data signal provided from the first latch node in response to a signal provided from the second control signal terminal of the shift register circuit, and output the at least one data signal to the second stage sub-circuit.

3. The source driving sub-circuit according to claim 1, wherein the second stage sub-circuit includes a second transmission sub-circuit and a second latch sub-circuit;
    the second transmission sub-circuit is coupled to the first stage sub-circuit, a first turn-on signal terminal and a second latch node; and the second transmission sub-circuit is configured to transmit signal output from the first stage sub-circuit to the second latch node in response to a signal provided from the first turn-on signal terminal; and
    the second latch sub-circuit is coupled to the second latch node and a second turn-on signal terminal; and the second latch sub-circuit is configured to latch the at least one data signal provided from the second latch node and output the at least one data signal in response to a signal provided from the second turn-on signal terminal.

4. The source driving sub-circuit according to claim 2, wherein the first transmission sub-circuit includes a first transmission gate;
    an input terminal of the first transmission gate is coupled to the data signal terminal, a first control terminal and a second control terminal of the first transmission gate are respectively coupled to the first control signal terminal and the second control signal terminal of the shift register circuit, and an output terminal of the first transmission gate is coupled to the first latch node.

5. The source driving sub-circuit according to claim 2, wherein the first latch sub-circuit includes a second transmission gate, a first inverter, a second inverter and a third inverter;

an input terminal of the second transmission gate is coupled to an output terminal of the third inverter, a first control terminal and a second control terminal of the second transmission gate are respectively coupled to the first control signal terminal and the second control signal terminal of the shift register circuit, and an output terminal of the second transmission gate is coupled to the first latch node;

an input terminal of the first inverter is coupled to the first latch node, and an output terminal of the first inverter is coupled to an input terminal of the third inverter and an input terminal of the second inverter; and an output terminal of the second inverter is coupled to the second stage sub-circuit.

6. The source driving sub-circuit according to claim 5, wherein the resetter is coupled to the first stage sub-circuit and the resetter includes a reset transistor, wherein a gate of reset transistor is coupled to the enabling signal terminal, a first electrode of the reset transistor is coupled to the reset signal terminal, and a second electrode of the reset transistor is coupled to the input terminal of the first inverter; or a gate of reset transistor is coupled to the enabling signal terminal, a first electrode of the reset transistor is coupled to the reset signal terminal, and a second electrode of the reset transistor is coupled to the output terminal of the first inverter.

7. The source driving sub-circuit according to claim 3, wherein the second transmission sub-circuit includes a third transmission gate;

an input terminal of the third transmission gate is coupled to the first stage sub-circuit, a first control terminal and a second control terminal of the third transmission gate are respectively coupled to the first turn-on signal terminal and the second turn-on signal terminal, and an output terminal of the third transmission gate is coupled to the second latch node.

8. The source driving sub-circuit according to claim 3, wherein the second latch sub-circuit includes a fourth transmission gate, a fourth inverter, a fifth inverter and a sixth inverter, wherein a first control terminal and a second control terminal of the fourth transmission gate are respectively coupled to the first turn-on signal terminal and the second turn-on signal terminal, an input terminal of the fourth transmission gate is coupled to an output terminal of the fifth inverter, and an output terminal of the fourth transmission gate is coupled to the second latch node;

the output terminal of the fourth inverter is coupled to the input terminal of the fifth inverter and an input terminal of the sixth inverter; and an output terminal of the sixth inverter is used as an output terminal of the second stage sub-circuit; or a first control terminal and a second control terminal of the fourth transmission gate are respectively coupled to the first turn-on signal terminal and the second turn-on signal terminal, an input terminal of the fourth transmission gate is coupled to an output terminal of the fourth inverter, and an output terminal of the fourth transmission gate is coupled to an input terminal of the fifth inverter;

the input terminal of the fourth inverter is coupled to the output terminal of the fifth inverter, and the output terminal of the fourth inverter is further coupled to an input terminal of the sixth inverter; and an output terminal of the sixth inverter is an output terminal of the second stage sub-circuit.

9. The source driving sub-circuit according to claim 8, wherein the resetter is coupled to the second stage sub-circuit and the resetter includes a reset transistor, wherein a gate of reset transistor is coupled to the enabling signal terminal, a first electrode of the reset transistor is coupled to the reset signal terminal, and a second electrode of the reset transistor is coupled to an input terminal of the fourth inverter; or a gate of reset transistor is coupled to the enabling signal terminal, a first electrode of the reset transistor is coupled to the reset signal terminal, and a second electrode of the reset transistor is coupled to the output terminal of the fourth inverter.

10. The source driving sub-circuit according to claim 1, wherein the latch circuit further includes a buffer, which includes a seventh inverter and an eighth inverter;

an input terminal of the seventh inverter is coupled to an output terminal of the second stage sub-circuit, and an output terminal of the seventh inverter is coupled to an input terminal of the eighth inverter; and an output terminal of the eighth inverter is an output terminal of the source driving sub-circuit.

11. A source driving circuit, comprising a plurality of source driving sub-circuits according to claim 1 arranged side by side, wherein shift register circuits in the plurality of source driving sub-circuits are cascaded in sequence.

12. A display device, comprising a host driver and the source driving circuit according to claim 11, wherein the host driver is coupled to source driving sub-circuits of the source driving circuit through data signal terminals.

13. The source driving sub-circuit according to claim 1, wherein the latch is further configured to be coupled to at least one data line, and output the at least one data signal to the at least one data line correspondingly.

14. The source driving sub-circuit according to claim 1, wherein the first stage sub-circuit is further configured to be coupled to at least one data line; and the second stage sub-circuit is configured to output the at least one data signal to the at least one data line correspondingly.

15. A method for driving the source driving sub-circuit according to claim 1, comprising:

resetting, by the resetter, the at least one data signal latched by the first stage sub-circuit or the at least one data signal latched by the second stage sub-circuit in response to the signal provided from the enabling signal terminal;

latching, by the first stage sub-circuit, the at least one data signal provided from the data signal terminal in response to the signals output from the shift register circuit;

outputting, by the first stage sub-circuit, the at least one data signal to the second stage sub-circuit; and latching, by the second stage sub-circuit, the at least one data signal output from the first stage sub-circuit, wherein resetting, by the resetter, the at least one data signal latched by the first stage sub-circuit in response to the signal provided from the enabling signal terminal includes: controlling, by the signal provided from the enabling signal terminal, the reset transistor to be turned on, and outputting the signal provided from the reset signal terminal to the first stage sub-circuit through the reset transistor; or resetting, by the resetter, the at least one data signal latched by the second stage sub-circuit in response to the signal provided from the enabling signal terminal includes: controlling, by the signal provided from the enabling signal terminal, the reset transistor to be turned on, and outputting the signal provided from the reset signal terminal to the second stage sub-circuit through the reset transistor.

16. The method for driving the source driving sub-circuit according to claim 15, further comprising:

outputting, by the second stage sub-circuit, the latched at least one data signal to corresponding at least one data line.

\* \* \* \* \*